United States Patent [19]

Ewing

[11] Patent Number: 4,585,994

[45] Date of Patent: Apr. 29, 1986

[54] NUCLEAR MAGNETIC RESONANCE IMAGING SYSTEM

[75] Inventor: James R. Ewing, Detroit, Mich.

[73] Assignee: Henry Ford Hospital, Detroit, Mich.

[21] Appl. No.: 514,169

[22] Filed: Jul. 15, 1983

[51] Int. Cl.[4] .............................................. G01R 33/20
[52] U.S. Cl. ...................................... 324/318; 324/300
[58] Field of Search ................................. 324/307–309, 324/321, 300, 318, 319, 322; 361/267; 174/35 R, 34; 335/301

[56] References Cited

U.S. PATENT DOCUMENTS

| | | | |
|---|---|---|---|
| 3,187,237 | 6/1965 | Craig | 335/301 |
| 4,354,499 | 10/1982 | Damadian | 324/309 |
| 4,489,218 | 12/1984 | Delassus | 174/35 R |
| 4,490,675 | 12/1984 | Knuettel | 324/319 |

Primary Examiner—Michael J. Tokar
Attorney, Agent, or Firm—Barnes, Kissele, Raisch, Choate, Whittemore & Hulbert

[57] ABSTRACT

A nuclear magnetic resonance imaging system comprising a high field solenoidal magnet providing a uniform static magnetic field surrounding a subject, an RF coil surrounding the subject, a receiver coil surrounding the subject, and a cylindrical shell of magnetic material surrounding the magnet and the RF and receiver coils. The shell is positioned such that the wall thereof lies in the area of the field of the magnet where the shell's permeability is substantially at a maximum for the imposed field such that the shell functions to substantially confine the field of the magnet to an area about the shell and the environment is not adversely affected and no additional protection is required surrounding the system.

11 Claims, 2 Drawing Figures

NUCLEAR MAGNETIC RESONANCE IMAGING SYSTEM

This invention relates to nuclear magnetic resonance imaging systems, as well as other medical systems employing large-bore (50 cm or more), high-field solenoidal magnets.

BACKGROUND AND SUMMARY OF THE INVENTION

In recent developments in medical diagnosis and examination, a technique known as nuclear magnetic resonance (NMR) imaging has come into use in neurological diagnosis. Techniques related to NMR imaging have been used for chemical diagnosis.

Such NMR systems conventionally comprise a large solenoidal magnet which provides a uniform magnetic field surrounding the subject, a radio-frequency (RF) coil surrounding the subject matter and a receiver coil surrounding the subject. As the size of the systems has increased, utilizing large magnets which are super cooled producing magnetic fields on the order of 10 kilogauss, significant problems have arisen with respect to shielding the magnetic field so that it does not affect persons or devices in the proximity. Thus, in order to prevent such adverse affects, it has become common to isolate the building containing the NMR system or to shield the walls of the buildings with appropriate shielding panels.

Accordingly, among the objectives of the present invention are to provide an NMR system which will effectively confine the magnetic field of the NMR system without affecting the field to any great extent, which maintain the central field at a large magnitude and which will not adversely affect the environment such that no additional protection is required for the system. In addition, an objective of the present invention is to preserve the uniformity of the high field in the center of the magnet. The shield has the effect of screening out the perturbing effects of large masses of magnetic material near the system magnet.

In accordance with the invention, a cylindrical shell of magnetic material surrounds the magnet and the RF and receiver coils. The shell is positioned such that the wall thereof lies in the area of the field of the magnet where permeability is substantially at a maximum in the shell material for the imposed field such that the shell functions to substantially confine the field of the magnet to an area about the shell and the environment is not adversely affected and no additional protection is required surrounding the system.

DESCRIPTION

Figure 1:
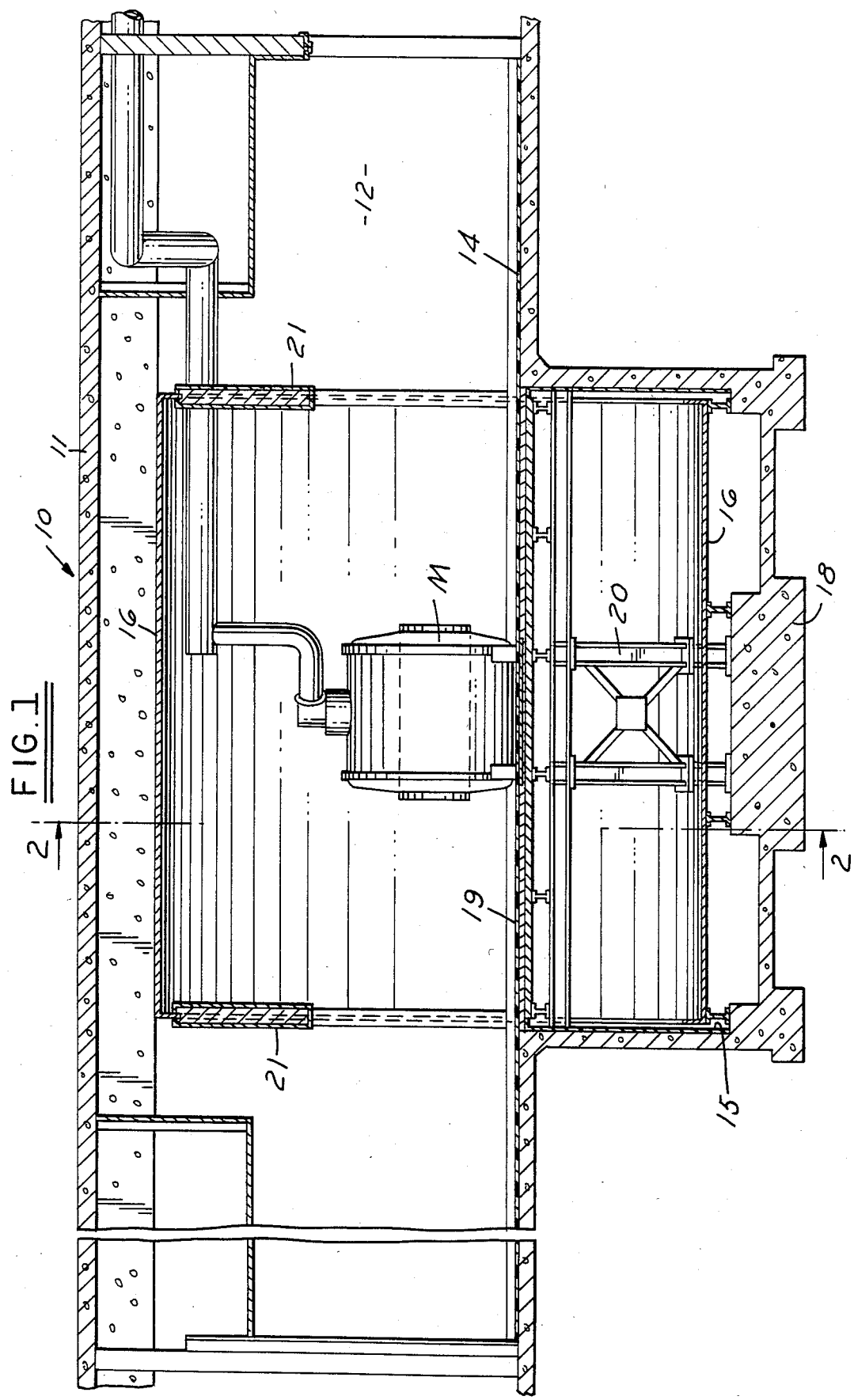
FIG. 1 is a sectional side elevational view of an NMR system embodying the invention.
Figure 2:
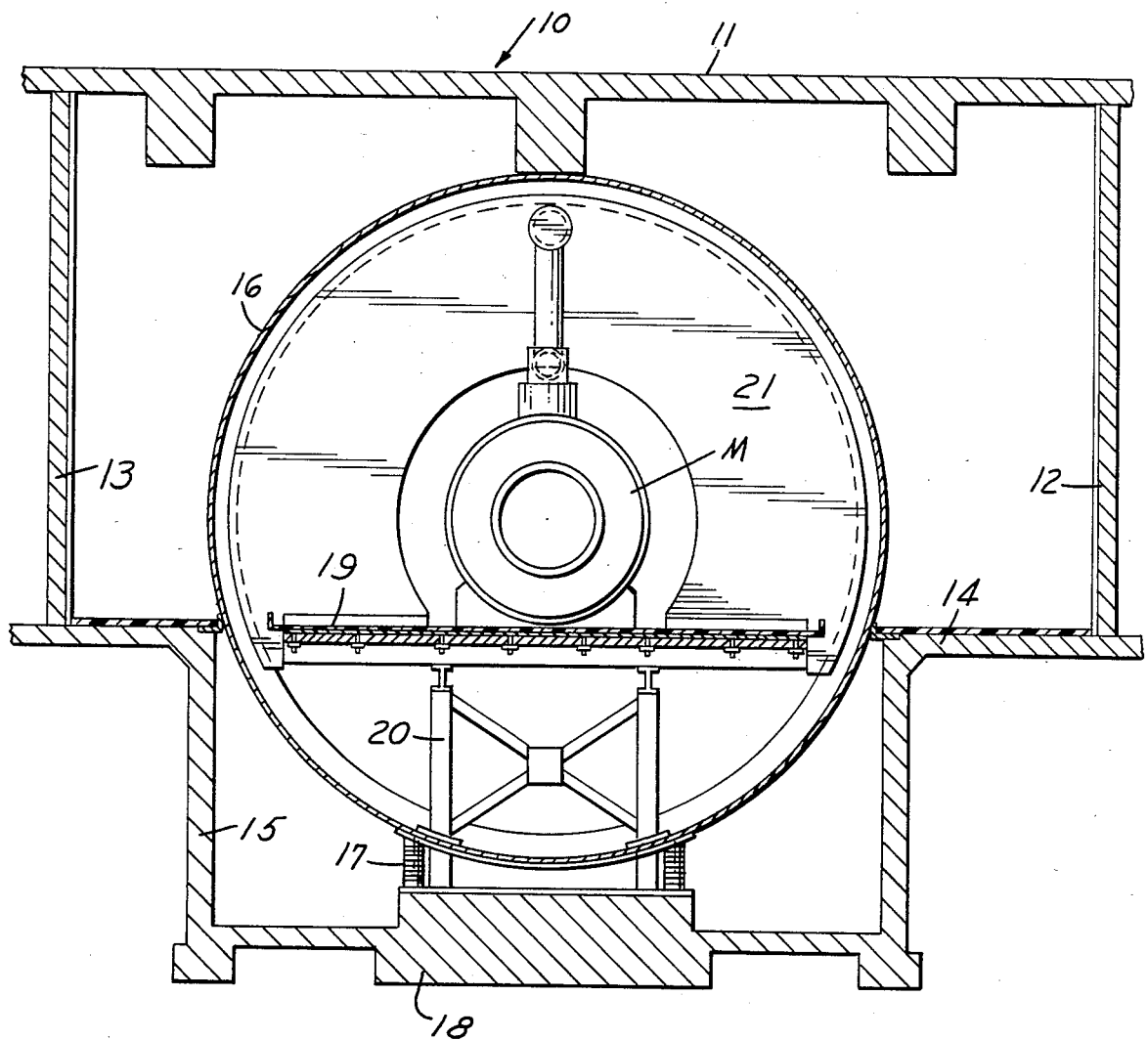
FIG. 2 is an end view of the system taken along the line 2—2 in FIG. 1.

Referring to FIGS. 1 and 2, the invention is shown in connection with an NMR system and preferably includes a room 10 having a top wall 11, side walls 12, 13, and a floor 14, a pit or excavation 15 is provided in the floor, and a cylinder 16 that forms the shield for the system is supported by stanchion 17 on a foundation 18 within the pit so that the portion of the cylinder is below floor level but the center of the cylinder is above floor level. A floor 19 of non-magnetic material such as aluminum is supported by a frame network 20 so that the level of the floor is at the same as the level of the floor 14 of the room.

The nuclear magnetic resonance magnet M is supported on the non-magnetic floor 19 with its axis concentric with the axis of the shield 16, preferably within one-half centimeter. The imaging system includes a conventional radio-frequency (RF) coil and a receiver coil as is well known in the art. The magnet M is preferably of the super cooled variety which will produce magnetic fields on the order of 10 to 20 kilogauss.

The shell or shield 16 is made of a magnetic material preferably annealed cold rolled steel that may be made of several pieces welded to form a continuous cylindrical body, the ends of which are open. In use, end walls 21 are provided and made of a heat insulating material such as gypsum board in the form of an annular wall leaving the ends open for movement of a subject or patient on a stretcher or other device within the magnet.

The diameter of the shield 16 is such that the material of the shield is positioned radially outwardly about the magnet at a point where the permeability of the shield under the influence of the magnetic field of the magnet is a maximum or peak. The thickness of the shield is such that there is sufficient magnetic material to bring fields external to the shell to less than 8 gauss.

The use of the shield and the positioning of the field has the effect of shielding the area beyond the shield so that the environment is not adversely affected and electrical devices such as pacemakers are not adversely affected.

Although the applicant does not wish to be bound by the theory involved, it is believed that the use of the cylindrical shell as a shield in the field of the magnet provides a countermagnetic field that functions to minimize any tendency of the main magnetic field at the magnet to extend to any great extent beyond the diameter of the shell. The shield has the effect of cancelling major components of the field due to the central source, namely, the magnetic field outside of the shield. The effect of the shield on the central field of the magnet is uniform and minimal. Thus, the shielding effect of the shell is one of an induced countervailing magnetic field which has its greatest relative effect external to the shield.

In a typical installation, a solenoidal magnet comprises three current rings spaced along their common axis. The central ring has a radius of 52.5 cm. and is 15 cm. long. It carries $0.5 \times 10^6$ amp turns. The two outer rings have a radius of 41.25 cm. and start from the centerline of the central ring at 25.5 cm., ending at 57 cm. Each of these two rings placed equal distance from the center of the central ring carries $0.5 \times 10^6$ amp turns of current.

It is desired to reduce the peak fringing field at 3.6 meters to less than 8 gauss. The peak unshielded field at 3.6 meters is 44 gauss.

A shell is 20 feet long and 9 feet in radius, one inch thick, of annealed mild steel. The maximum carbon content of the material is 0.01 percent.

In order to prevent a large force on the central magnet, the concentricity of the shield and magnet should be preserved to within 5 cm. The co-angularity of the cylinder and magnet must be preserved to within 3 degrees. The cylindricality of the shield must be to within + or $-\frac{1}{2}$ cm.

I claim:

1. A nuclear magnetic resonance imaging system for placement in a building comprising
   a high field solenoid magnet providing a uniform static magnetic field,
   said solenoid having both ends open defining an opening into which a human subject can be positioned,
   an RF coil surrounding the subject,
   a receiver coil surrounding the subject, and
   a substantially continuous cylindrical shell of magnetic material surrounding the magnet and the RF and receiver coils,
   said shell having a radius such that the wall thereof lies in the area of the field of the magnet where permeability is substantially at a maximum for the imposed field,
   said shell having a radius substantially greater than the diameter of the magnet,
   said shell having a length substantially greater than the length of the magnet,
   such that the shell functions to substantially confine the field of the magnet to an area about the shell, the environment is not adversely affected and no additional protection is required surrounding the system.

2. The nuclear magnetic resonance imaging system set forth in claim 1 wherein said shell is made of annealed cold rolled steel.

3. The nuclear magnetic resonance imaging system set forth in claim 1 including a room having a floor in which said system is positioned,
   said system including a non-magnetic floor within said shell externally of said magnet and coplanar with the floor of said room.

4. The nuclear magnetic resonance imaging system set forth in claim 1 wherein said system includes a non-magnetic support supporting a subject to be examined.

5. The nuclear magnetic resonance imaging system set forth in claim 1 wherein the concentricity of the shield and magnet is within 5 cm. and the co-angularity of the cylinder and magnet is within 3 degrees.

6. A nuclear magnetic resonance imaging system for placement in a building comprising
   a high field solenoidal magnet providing a uniform static magnetic field,
   said solenoid having both ends open defining an opening into which a human subject can be positioned,
   an RF coil surrounding the subject,
   a receiver coil surrounding the subject, and
   a substantially cylindrical and continuous shell of annealed cold rolled steel surrounding the magnet and the RF and receiver coils and concentric thereto within one-half centimeter,
   said shell having a radius,
   said shell having a radius substantially greater than the diameter of the magnet,
   said shell having a length substantially greater than the length of the magnet,
   such that the wall thereof lies in the area of the field of the magnet where permeability is substantially at a maximum for the imposed field such that the shell functions to substantially confine the field of the magnet to an area about the shell, the environment is not adversely affect and no additional protection is required surrounding the system.

7. The nuclear magnetic resonance imaging system set forth in claim 6 including a room having a floor in which said system is positioned,
   said system including a non-magnetic floor within said shell externally of said magnet and coplanar with the floor of said room.

8. The nuclear magnetic resonance imaging system set forth in claim 6 wherein said system includes a non-magnetic support movable axially into and out of the magnet for supporting a subject to be examined.

9. The nuclear magnetic resonance imaging system set forth in claim 6 wherein the concentricity of the shield and magnet is within 5 cm. and the co-angularity of the cylinder and magnet is within 3 degrees.

10. In a nuclear magnetic resonance imaging system comprising a high field solenoid magnet providing a uniform static magnetic field surrounding a subject, an RF coil surrounding the subject, a receiver coil surrounding the subject, the method which comprises
    positioning a cylindrical shell of magnetic material about the magnet and the RF and receiver coils such that the wall thereof lies in the area of the field of the magnet where permeability is substantially at a maximum for the imposed field such that the shell functions to substantially confine the field of the magnet to an area about the shell, the environment is not adversely affected and no additional protection is required surrounding the system.

11. The method set forth in claim 10 wherein said step of positioning said shell is such that said shell and said magnet are concentric within one-half centimeter.

* * * * *